United States Patent
Huang et al.

(10) Patent No.: US 11,631,652 B2
(45) Date of Patent: Apr. 18, 2023

(54) METHOD AND APPARATUS FOR BONDING SEMICONDUCTOR SUBSTRATE

(71) Applicant: Taiwan Semiconductor Manufacturing Co., Ltd., Hsinchu (TW)

(72) Inventors: Ying-Jui Huang, Hsinchu County (TW); Ching-Hua Hsieh, Hsinchu (TW); Chien-Ling Hwang, Hsinchu (TW); Chia-Sheng Huang, Hsinchu County (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 559 days.

(21) Appl. No.: 16/663,362

(22) Filed: Oct. 25, 2019

(65) Prior Publication Data

US 2020/0227379 A1    Jul. 16, 2020

Related U.S. Application Data

(60) Provisional application No. 62/792,866, filed on Jan. 15, 2019.

(51) Int. Cl.
*H01L 23/00* (2006.01)
*H01L 21/67* (2006.01)
(Continued)

(52) U.S. Cl.
CPC ........ *H01L 24/83* (2013.01); *H01L 21/67092* (2013.01); *H01L 21/67259* (2013.01);
(Continued)

(58) Field of Classification Search
CPC ............ H01L 21/67259; H01L 21/681; H01L 2224/75753; H01L 2224/80132; H01L 2224/83132; H01L 2224/81132; H01L 2224/82132; H01L 24/75; H01L 2224/84132; H01L 2224/85132; H01L 2224/86132
See application file for complete search history.

(56) References Cited

U.S. PATENT DOCUMENTS

| 2004/0016930 A1* | 1/2004 | Yoshida | .................. H01L 22/32 257/E23.179 |
| 2015/0044786 A1* | 2/2015 | Huang | .............. H01L 21/67092 156/359 |

(Continued)

*Primary Examiner* — Erik T. K. Peterson
(74) *Attorney, Agent, or Firm* — JCIPRNET

(57) ABSTRACT

A method and an apparatus for bonding semiconductor substrates are provided. The method includes at least the following steps. A first position of a first semiconductor substrate on a first support is gauged by a gauging component embedded in the first support and a first sensor facing towards the gauging component. A second semiconductor substrate is transferred to a position above the first semiconductor substrate by a second support. A second position of the second semiconductor substrate is gauged by a second sensor mounted on the second support and located above the first support. The first semiconductor substrate is positioned based on the second position of the second semiconductor substrate. The second semiconductor substrate is bonded to the first semiconductor substrate.

20 Claims, 12 Drawing Sheets

(51) Int. Cl.
*H01L 21/68* (2006.01)
*H01L 21/82* (2006.01)

(52) U.S. Cl.
CPC ............ *H01L 21/681* (2013.01); *H01L 21/82* (2013.01); *H01L 24/75* (2013.01); *H01L 24/80* (2013.01); *H01L 2224/7565* (2013.01); *H01L 2224/75744* (2013.01); *H01L 2224/75745* (2013.01); *H01L 2224/75753* (2013.01)

(56) References Cited

U.S. PATENT DOCUMENTS

| | | | |
|---|---|---|---|
| 2017/0062257 A1* | 3/2017 | Speer | H01L 21/67144 |
| 2018/0144999 A1* | 5/2018 | Lu | H01L 24/94 |
| 2019/0148333 A1* | 5/2019 | Chen | H01L 24/75 |
| | | | 438/16 |
| 2019/0304852 A1* | 10/2019 | Seyama | H01L 22/12 |
| 2020/0279762 A1* | 9/2020 | Seyama | H01L 24/75 |

* cited by examiner

METHOD AND APPARATUS FOR BONDING SEMICONDUCTOR SUBSTRATE

CROSS-REFERENCE TO RELATED APPLICATION

This application claims the priority benefit of U.S. provisional application Ser. No. 62/792,866, filed on Jan. 15, 2019. The entirety of the above-mentioned patent application is hereby incorporated by reference herein and made a part of this specification.

BACKGROUND

Semiconductor devices are used in a variety of electronic applications, such as personal computers, cell phones, digital cameras, and other electronic devices. As the demand for shrinking electronic devices has grown, a need for smaller and more creative packaging techniques of semiconductor dies has emerged. As semiconductor technologies further advance, stacked semiconductor devices, three dimensional integrated circuits (3DICs) are a recent development in semiconductor packaging in which multiple semiconductor dies/wafers are stacked upon one another. Some methods of forming 3DICs involve bonding together two or more semiconductor wafers, and active circuits such as logic, memory, processor circuits and the like located on different semiconductor wafers. Resulting stacked semiconductor devices generally provide smaller form factors with improved performance and lower power consumption. However, since more different components with different materials are involved, complexity of the manufacturing and integration operations of the semiconductor devices is increased. As a result, there are more challenges to improve the manufacturing operations.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
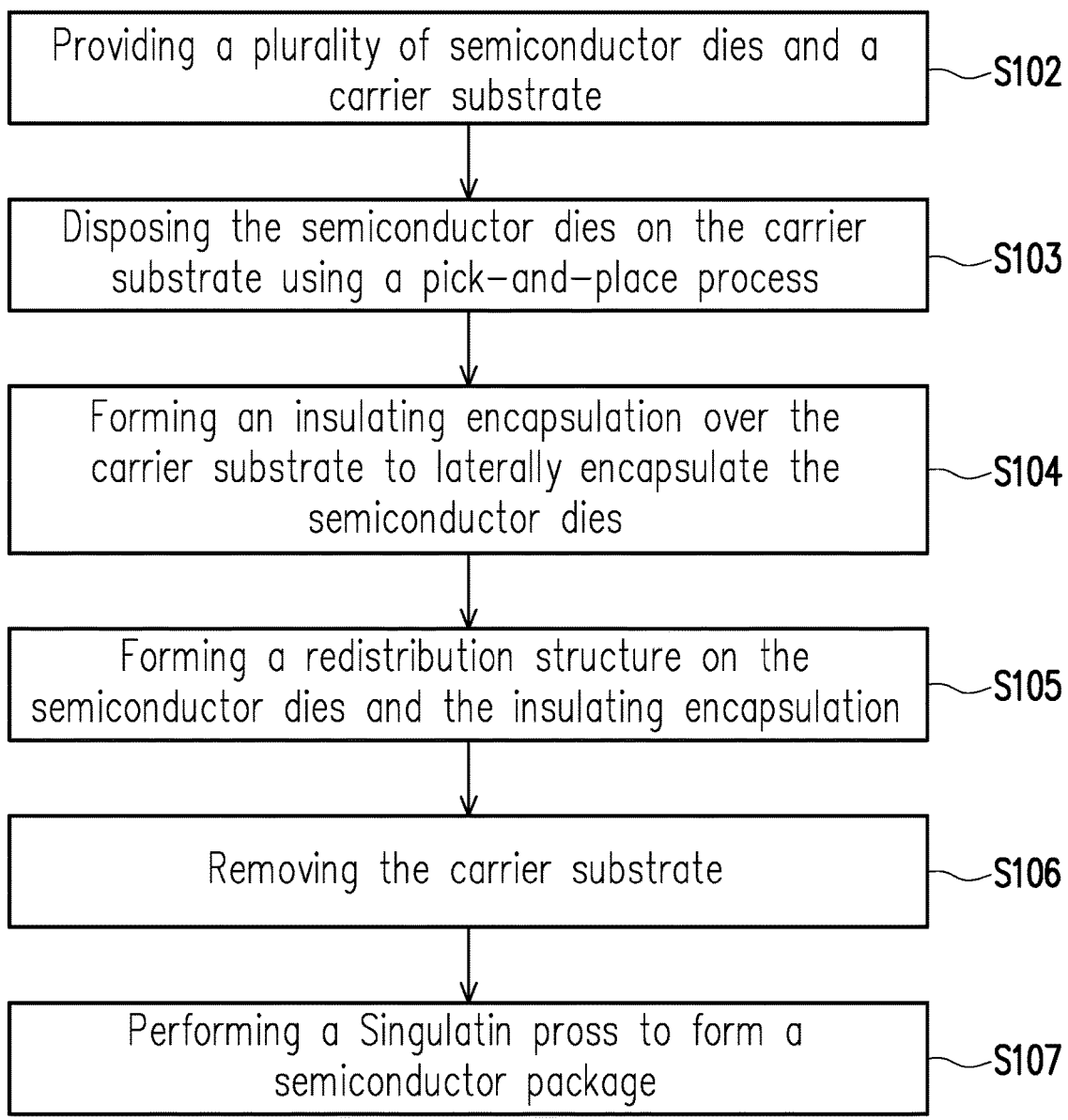
FIG. 1 is a schematic process flow for manufacturing a semiconductor package according to some exemplary embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," and the like, may be used herein for ease of description to describe similar or different element(s) or feature(s) as illustrated in the figures, and may be used interchangeably depending on the order of the presence or the contexts of the description.

FIG. 1 is a schematic process flow 10 for manufacturing a semiconductor package according to some exemplary embodiments of the disclosure. Referring to FIG. 1, in some embodiments, forming a semiconductor package includes at least the following steps. In step S102, a plurality of semiconductor dies and a carrier substrate are provided. For example, a semiconductor substrate is processed in a manner to form a plurality of individual semiconductor dies from the semiconductor substrate. In some embodiments, a semiconductor substrate is masked, etched, and doped through several processing steps to form a plurality of semiconductor devices therein by a front-end-of-line (FEOL) operation. For example, the semiconductor substrate includes a bulk semiconductor, a semiconductor-on-insulator (SOI) substrate, other supporting substrate (e.g., quartz, glass, etc.), combinations thereof, or the like, which may be doped or undoped. In some embodiments, the semiconductor substrate includes an elementary semiconductor (e.g., silicon or germanium in a crystalline, a polycrystalline, or an amorphous structure, etc.), a compound semiconductor (e.g., silicon carbide, gallium arsenide, gallium phosphide, indium phosphide, indium arsenide, and/or indium antimonide, etc.), an alloy semiconductor (e.g., silicon-germanium (SiGe), gallium arsenide phosphide (GaAsP), aluminum indium arsenide (AlInAs), aluminium gallium arsenide (AlGaAs), gallium indium arsenide (GaInAs), gallium indium phosphide (GaInP), etc.), combinations thereof, or other suitable materials. For example, the compound semiconductor substrate may have a multilayer structure, or the substrate may include a multilayer compound semiconductor structure. In some embodiments, the alloy SiGe is formed over a silicon substrate. In other embodiments, a SiGe substrate is strained. In some embodiments, the semiconductor substrate is a device wafer. The semiconductor devices may include active devices (e.g., transistors, diodes, etc.), passive devices (e.g., capacitors, resistors, inductors, etc.) or other suitable devices depending on product requirements.

Next, an interconnect structure may be formed over the semiconductor substrate to interconnect the semiconductor devices by a back-end-of-line (BEOL) operation. For example, the interconnect structure includes inter-layer dielectric (ILD) layers covering the semiconductor devices, and inter-metallization dielectric (IMD) layers formed over the ILD layers. Subsequently, a plurality of conductive terminals may be formed on the topmost one of the IMD layers for further electrical connection. A protection layer is optionally formed to cover the conductive terminals to prevent damage. A thinning process is optionally performed on the protection layer to accessibly reveal at least a portion of the conductive terminals for further electrical connection. After formation, a singulation process may be performed along scribe lines to dice the processed semiconductor substrate into a plurality of semiconductor dies (or chips). Each semiconductor die may include an active surface including the conductive terminals thereon, and a back surface opposite to the active surface. Since multiple semiconductor dies are respectively singulated, known-good-dies (KGDs) may be selected through die test for the subsequent processing. The singulated semiconductor dies may be the same or different in functions and properties.

The carrier substrate may be provided. In some embodiments, the carrier substrate has a planar surface in order to accommodate the semiconductor dies thereon. The carrier substrate may be formed of glass, silicon, glass ceramics, quartz, silicon oxide, aluminum oxide, polymer, plastic, or the like. In some embodiments, a bonding layer is formed on the carrier substrate. For example, the bonding layer may be or may include an adhesive tape, a die-attach film (DAF), or other suitable bonding layer. The bonding layer may be a layer having the characteristic that when heated, becomes sticky enough, and hence semiconductor dies may be adhered thereon. In some embodiments, a layer of light-to-heat-conversion (LTHC) release coating which loses its adhesive property when exposed to UV lights, and a layer of associated adhesive may be formed on the carrier substrate. In some other embodiments, the bonding layer is attached on the back surfaces of semiconductor dies before or after singulating from the semiconductor substrate.

In step S103, the semiconductor dies are disposed on the carrier substrate using a pick-and-place process. For example, after forming the semiconductor dies, transferring equipment (e.g., a bond head, a robot arm, etc.) may pick up and transfer each semiconductor die (or known-good-dies) towards an intended position on the carrier substrate. The semiconductor dies may be securely moved by the bond head using vacuum system, clamping fixture, or other suitable mechanism on the transferring equipment. Next, the semiconductor dies may be positioned over the carrier substrate before placing. Once the semiconductor dies are aligned with the predetermined positions relative to the carrier substrate, the transferring equipment (e.g., pickup head, bond head, etc.) may lower the semiconductor dies to place on the carrier substrate. In some embodiments, after sequentially placing the semiconductor dies, the semiconductor dies are separately disposed on the carrier substrate. The back surfaces of the semiconductor dies may be attached to the carrier substrate through the bonding layer, and the step may be referred to as a bonding process in the following descriptions. After the semiconductor dies are placed on the carrier substrate, the transferring equipment may be removed. The carrier substrate may provide temporary mechanical and structural support to the semiconductor dies during subsequent processes.

As the semiconductor industry continues trending towards denser and denser integration of circuit and components, the size of the semiconductor die are becoming increasingly smaller and more functions have to be integrated into the semiconductor dies. The semiconductor die may have increasingly greater number of the conductive terminals of the semiconductor die, and the subsequently formed redistribution structure needs to have finer line and spacing within a given area. This requires that disposing of each semiconductor die on the carrier substrate accompanied by an alignment step to ensure the alignment accuracy for the subsequent processes. Thus, alignment between the semiconductor dies and the underlying carrier substrate and/or between the subsequently formed redistribution structure is significant during semiconductor processing. The alignment process may reduce manufacturing defects and allow for subsequently formed redistribution structure designs having smaller buffer areas and finer pitch. The greater details of the aligning and bonding processes for disposing the semiconductor die on the carrier substrate will be discussed later in other embodiments.

In step S104, after disposing the semiconductor dies, an insulating encapsulation may be formed over the carrier substrate to at least laterally encapsulate the semiconductor dies. For example, an insulating material (e.g., a molding compound including an epoxy resin, phenol resin, or the like, a molding underfill, or other suitable electrically insulating material) is formed over the carrier substrate and extends along the sidewalls of each semiconductor die using compressive molding, transfer molding, or other suitable process. In some embodiments, the active surfaces of the semiconductor dies are also covered by the insulating material, and then a thinning process may be performed to the insulating material so as to form the insulating encapsulation. For example, the thinning process includes grinding, chemical mechanical polish (CMP), planarization, or other suitable techniques. The thinning process may be performed until at least a portion of the conductive terminals of each semiconductor die is accessibly exposed for further electrical connection.

In step S105, after forming the insulating encapsulation, a redistribution structure is formed on the insulating encapsulation and the semiconductor dies. For example, the redistribution structure includes at least one patterned dielectric layer and at least one patterned conductive layer embedded in the patterned dielectric layer using suitable depositing, patterning, and metallization techniques (e.g., dielectric deposition, lithography, etching, seed layer deposition, plating, planarization, etc.). The patterned conductive layer may be in physical and electrical contact with the conductive terminals of the semiconductor dies. In some embodiments, the insulating encapsulation provides lateral surfaces for supporting portions of the patterned conductive layer of the redistribution structure extending past edges of one of the semiconductor dies. Since the redistribution structure connected to the conductive terminals of the semiconductor dies reroutes the electrical signal of the semiconductor dies and expands wider than the size of at least one of semiconductor dies, the redistribution structure may be referred to as a fan-out redistribution structure. In some embodiments, a plurality of external terminals may be formed on the patterned conductive layer for further electrical connection. For example, the external terminals may be conductive balls formed by ball placement and reflowing, plating, or other suitable process.

In step S106, the carrier substrate may be removed from the insulating encapsulation and the semiconductor dies. In some embodiments, the removal process of the carrier substrate include a mechanical peel-off process, a grinding process, or an etching process, and may include additional cleaning process. In other embodiments, light illumination (e.g., UV light, laser, or the like) may be introduced to the LTHC film of the bonding layer to separate the carrier substrate from the insulating encapsulation.

In step S107, a singulation process is performed onto the resulted structure to dice the resulted structure into a plurality of semiconductor packages. For example, a saw or other cutting device separates the individual units of the semiconductor packages along scribe lines. In some embodiments, the semiconductor package is referred to as an integrated fan-out (InFO) package. The aforementioned steps may be performed at wafer level and may be referred to as wafer level packaging (WLP) process.

It should be noted that the steps described above are provided for illustrative purposes only, and the embodiments are not limited to the order of steps and structure described above. It should be also noted that other embodiments may utilize fewer or additional elements to form various structures of semiconductor package (e.g., package-on-package (PoP), system-in-package (SiP), or the like.). In the above discussed embodiments, the semiconductor dies are bonded to the carrier substrate which will be removed before singulation. However, the bonding method provided herein may be used with bonding methods for other types of semiconductor processing. In an aspect of wafer level packaging (WLP), WLP is employed in a variety of technologies including three-dimensional integrated circuits (3DICs) techniques. For example, 3DICs techniques provide a way to combine two or more semiconductor devices manufactured on different semiconductor substrates into a single package. In some embodiments, two or more semiconductor substrates (or semiconductor dies) may be disposed on top of one another and may be bonded together through suitable bonding techniques. For example, two semiconductor substrates (or semiconductor dies) are bonded using such as flip-chip (face-to-face) bonding, back-to-back bonding, face-to-back bonding, or the like. The term "face" may refer to the semiconductor die or substrate having active surface that has electrical functions that contribute to the electrical operation of the resulting package, and the term "back" may refer to the semiconductor die or substrate having back surface that does not have any electrical function and also does not contribute to the electrical operation of the resulting package. An electrical connection (e.g., through semiconductor vias (TSVs) or the like) may be provided between the stacked semiconductor substrates. The stacked semiconductor substrates may provide a higher density with smaller form factors and allow for increased performance and lower power consumption. In applications where two semiconductor substrates are bonded to form a stacked semiconductor structure, alignment accuracy is important for device performance and scalability. The greater details will be discussed later in other embodiments.

Figure 2A:
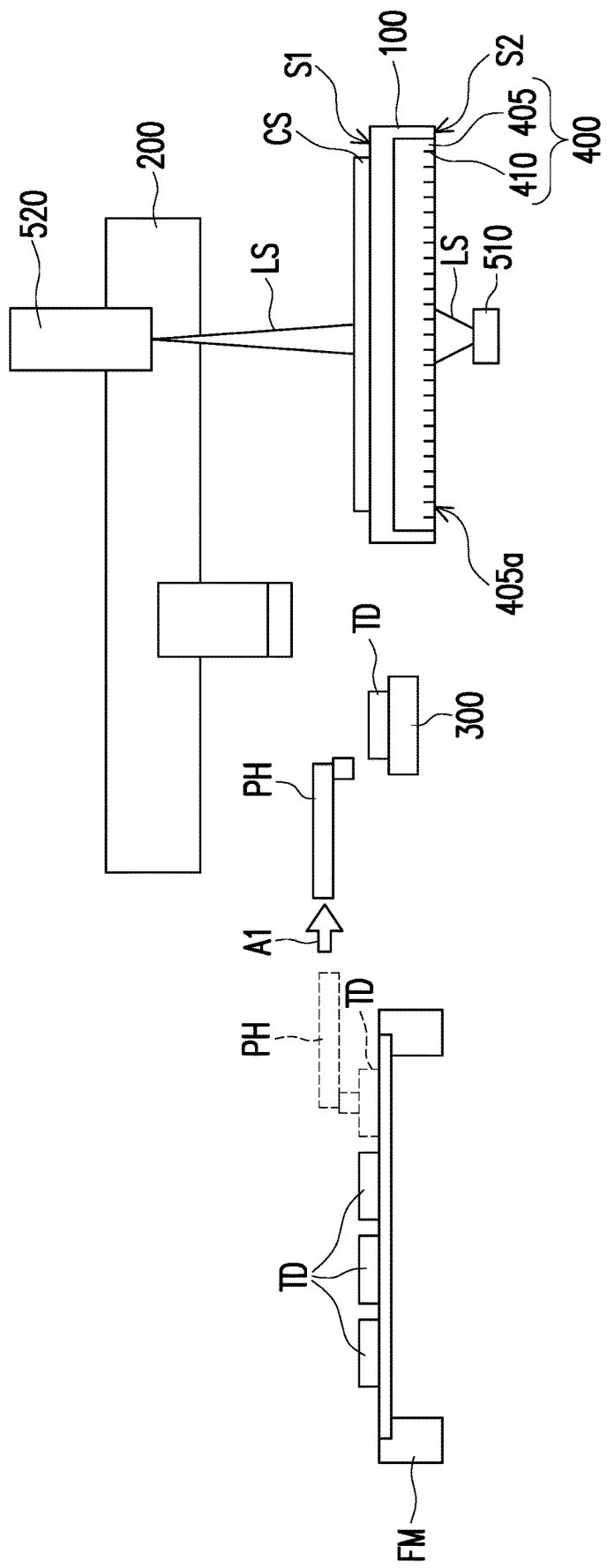
FIG. 2A to FIG. 2C are schematic cross-sectional views of various stages in a method for bonding semiconductor substrates according to some exemplary embodiments of the disclosure.
Figure 2B:
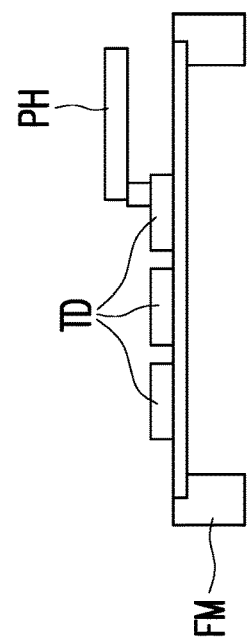
Figure 2B:
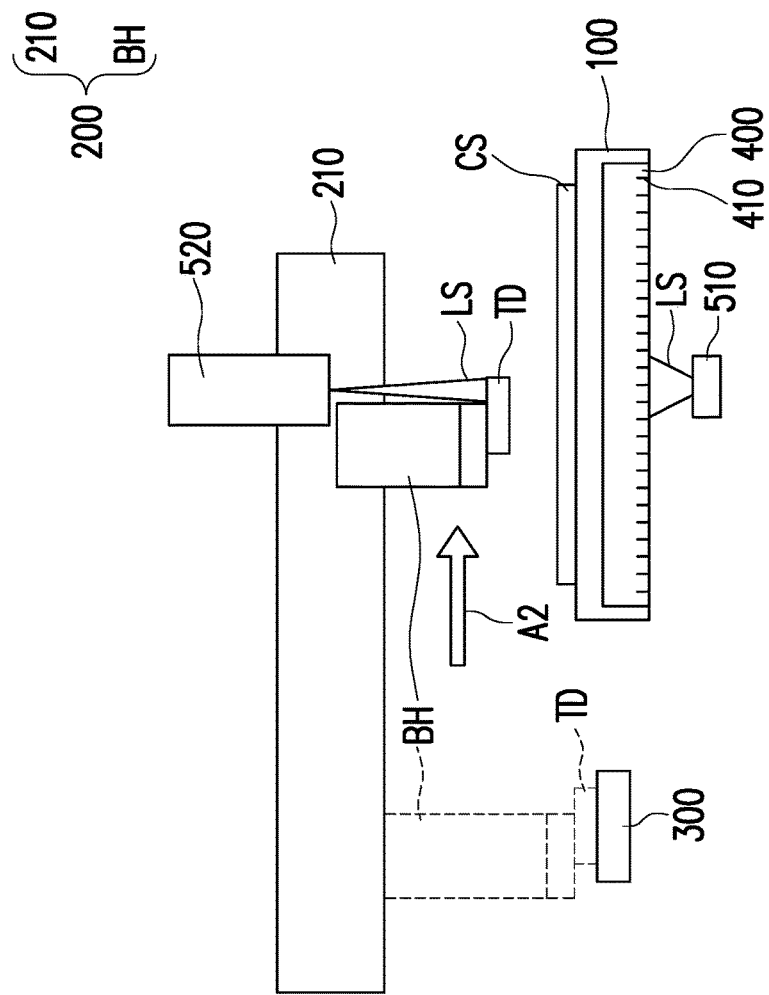
Figure 2C:
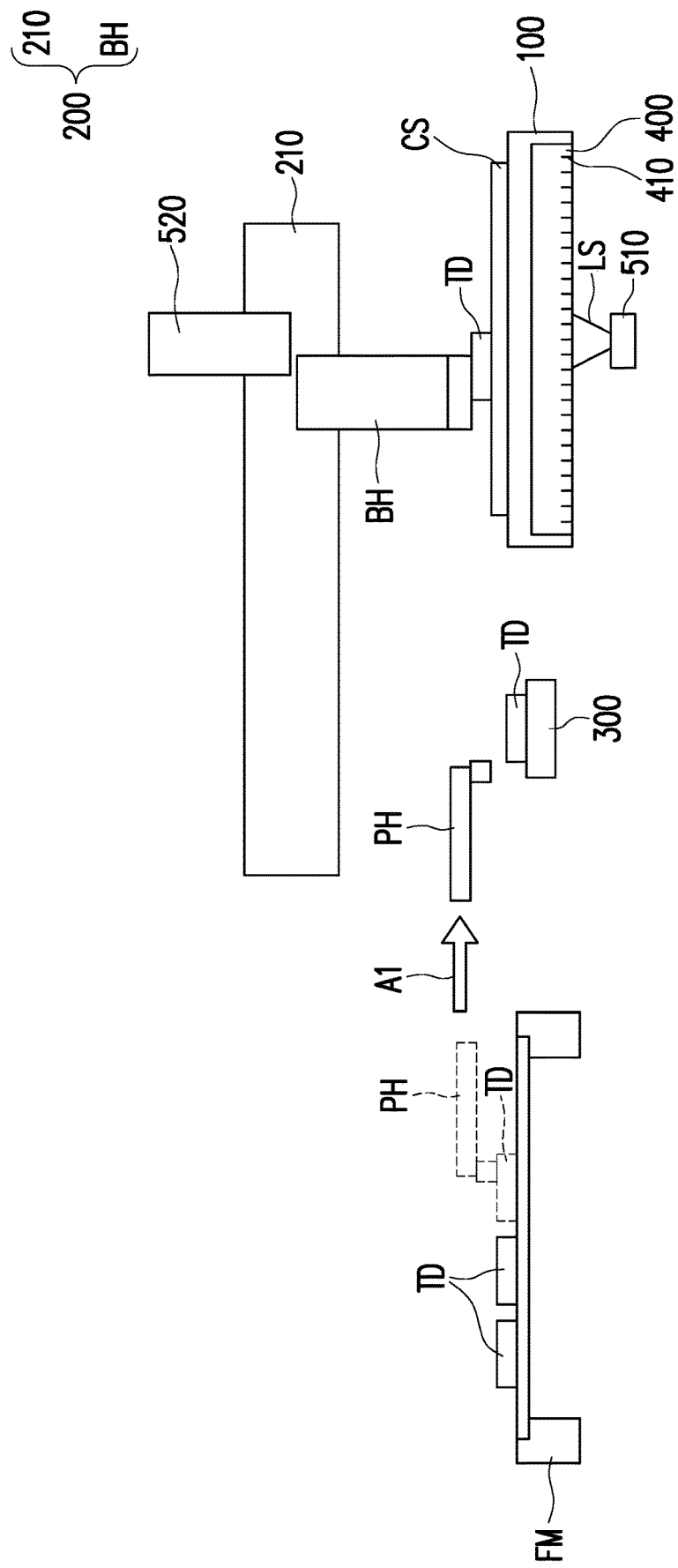

FIG. 2A to FIG. 2C are schematic cross-sectional views of various stages in a method for bonding semiconductor substrates according to some exemplary embodiments of the disclosure. The following descriptions may be a part of the step illustrated as the step S103 shown in FIG. 1. Referring to FIG. 2A, to perform a picking process and a placing/bonding process using a bonding system, a position of a first semiconductor substrate CS on a first support 100 is gauged. A second semiconductor substrate TD may be transferred from a frame FM for bonding to the first semiconductor substrate CS.

For example, the first support 100 of the bonding system may be or may include a chuck which is configured to carry the first semiconductor substrate CS and the subsequently bonded second semiconductor substrate TD. For example, the chuck includes glass, quartz, or other type of transparent material. The transparent material can improve the alignment of the first semiconductor substrate CS due to increased visibility. In some embodiments, the chuck may include translucent or opaque material. In some embodiments, the first support 100 includes a vacuum system or clamping fixture (not shown) for securing the structure disposed thereon. Other mechanism for securing the structure placed on the first support 100 may be used. In some embodiments, the first support 100 is configured to adjust a position of the first semiconductor substrate CS before and/or during a bonding process. For example, the first support 100 includes a driving unit (e.g., motor, controller, and processor, etc.; not shown) for adjusting an x position, a y position, a z position, and/or an angular position of the first semiconductor substrate CS. In some embodiments, the x, y, z, and θ direction of the first semiconductor substrate CS is corrected by fine tuning of alignment controlled by the first support 100. The first semiconductor substrate CS may be or may include a carrier substrate for providing temporary mechanical and structural support to the singulated semiconductor dies during subsequent packaging processes (e.g., the steps S104 and S105 described in FIG. 1). In some embodiments, the first semiconductor substrate CS includes at least two alignment marks disposed thereon for positioning. If the first semiconductor substrate CS includes the alignment marks, that should be noted that the number, the shapes, and the forms of the alignment marks construe no limitation in the disclosure. Alternatively, the first semiconductor substrate CS is free of alignment mark. In some embodiments in which the first semiconductor substrate CS is provided without alignment mark, the relative position may be define by the outline of the first semiconductor substrate CS for positioning.

For example, the first support 100 includes a carrying side S1 and a rear side S2 opposite to the carrying side S1. The first semiconductor substrate CS may be disposed at the carrying side S1 of the first support 100, and a position of the first semiconductor substrate CS is gauged on the first support 100. In some embodiments, the first support 100 includes an alignment mark (not shown) disposed at the carrying side S1 and/or the rear side S2 for aligning the first semiconductor substrate CS. In some embodiments, the bonding system includes a gauging component 400 embedded in the first support 100 for gauging the position of the first semiconductor substrate CS. An alignment accuracy of the gauging component 400 may be better than an alignment accuracy of the first support 100. The first support 100 includes mechanical configurations, which lead to mechanical wear, and such mechanical configurations may affect accuracy and performance over time. For example, the accuracy of the first support 100 becomes worse than 5 µm due to the mechanical configurations and/or the long-term use. However, control of the first support 100 may not be precisely accurate, and the first semiconductor substrate CS may be slightly misaligned with the first support 100. In order to compensate the limitation of the accuracy of the first support 100, the gauging component 400 having better alignment accuracy and stability may be used to position the first semiconductor substrate CS. For example, the accuracy of the gauging component 400 is about 1 μm or less.

In some embodiments, after placing the first semiconductor substrate CS on the first support 100, two-step of aligning may be performed. For example, a first alignment process is performed on the first semiconductor substrate CS based on the alignment accuracy of the first support 100. Subsequently, a second alignment process is performed on the first semiconductor substrate CS based on the alignment accuracy of the gauging component 400 which is put in the first support 100. In some embodiments, the position of the first semiconductor substrate CS is adjusted based on the alignment mark disposed on the first support 100 (or on the first semiconductor substrate CS) during the first alignment process, and then the adjusted position of the first semiconductor substrate CS is further regulated and calibrated based on the gauging component 400 during the second alignment process, such that the first semiconductor substrate CS may be precisely positioned at the predetermined position for bonding.

In some embodiments, the bonding system includes a first sensor 510 disposed proximate to the gauging component 400. The gauging component 400 may be or may include a wafer (or a photomask) 405 and a fiducial pattern 410 (or an alignment mark) formed on a surface 405a of the wafer 405. In some embodiments, the distribution area of the fiducial pattern 410 of the gauging component 400 is greater than the bonding area of the first semiconductor substrate CS, so that all of the predetermined positions of the first semiconductor substrate CS for bonding may be identified and measured by the fiducial pattern 410 of the gauging component 400. The details of the fiducial pattern 410 of the gauging component 400 and a gauging method using the fiducial pattern 410 of the gauging component 400 will be described later in accompanying with FIG. 5A and FIG. 5B.

In some embodiments, the gauging component 400 is inlaid at the rear side S2 of the first support 100, and the surface 405a where the fiducial pattern 410 is disposed on may face towards the first sensor 510. In some embodiments, the first sensor 510 includes a light source LS for illuminating the gauging component 400, an imaging system (not shown) for taking up the image of selected regions, and an enlarging focusing system (not shown) for capturing an enlarged image of the selected regions. For example, the first sensor 510 is configured to emit the light source LS towards the fiducial pattern 410 of the gauging component 400, so that when gauging the position of the first semiconductor substrate CS, a relative position of the first semiconductor substrate CS and the fiducial pattern 410 of the gauging component 400 may be detected and monitored by the first sensor 510. For example, the first sensor 510 includes a charge coupled device (CCD) image sensor, a complementary metal oxide semiconductor (CMOS) image sensor, or any other operable instruments to detect the pattern formed by the transmitted radiation. In some embodiments, the first sensor 510 includes an infrared (IR) live CCD adapted to emit reflective infrared (RIR) or transparent infrared (TIR) energy, or the like for monitoring the bonding process in real time. It should be noted that the first sensor 510 may include any suitable type of monitoring and detection equipment depending on process demands. The first sensor 510 may be used as a pattern recognition device for detecting the fiducial pattern 410 of the gauging component 400, so that the position of the first semiconductor substrate CS relative to the fiducial pattern 410 of the gauging component 400 may be determined based on the detecting result of the first sensor 510. For example, the first sensor 510 is in communication with the first support 100, so that the position of the first semiconductor substrate CS at the carrying side S1 of the first support 100 may be adjusted via the movement of the first support 100 and based on the detecting results of the first sensor 510. In some embodiments, the first sensor 510 is disposed integratedly mounted on the first support 100. Alternatively, the first sensor 510 is independently installed proximate to the gauging component 400. It should be noted that the configuration shown throughout the figures is an illustrative example configuration, and other configurations are possible.

Continue to FIG. 2A, in some embodiments, the bonding system includes a second support 200 disposed above the first support 100, and a second sensor 520 mounted on the second support 200 and located over the first support 100. The second sensor 520 disposed above the first support 100 may face downwardly to the first semiconductor substrate CS and/or the first support 100. In some embodiments, the second sensor 520 is configured to emit a light source LS towards the alignment mark disposed on the first support 100 (or disposed on the first semiconductor substrate CS) for positioning the first semiconductor substrate CS on the first support 100. The second sensor 520 may be used as a pattern/mark recognition device for detecting the alignment mark disposed on the first support 100 (or the alignment mark of the first semiconductor substrate CS). The second sensor 520 may be similar to the first sensor 510.

In some embodiments, the first sensor 510 and the second sensor 520 are optically and/or electrically coupled to one another. In certain embodiments in which the first semiconductor substrate CS is free of alignment mark for detecting, the first sensor 510 and the second sensor 520 may emit light sources LS towards and through the center point (or any other identifiable point) of the first semiconductor substrate CS for positioning the first semiconductor substrate CS on the fiducial pattern 410 of the gauging component 400. In some embodiments in which the first semiconductor substrate CS having alignment mark disposed thereon, the light sources LS of the first sensor 510 and the second sensor 520 may emit towards and through the alignment mark of the first semiconductor substrate CS for positioning. Alternatively, at least one of the first sensor 510 and the second sensor 520 may be configured to emit the light source(s) LS towards and through the alignment mark of the first support 100 for detecting and feeding back a relative position of the first semiconductor substrate CS and the fiducial pattern 410 of the gauging component 400, so that the position of the first semiconductor substrate CS may be adjusted based on the detecting results before and during a bonding process.

In some embodiments, the first sensor 510 and the second sensor 520 are calibrated in an online manner or offline manner before gauging the first semiconductor substrate CS. In some embodiments, the first sensor 510 and the second sensor 520 are coupled to a computing module which may be configured to receive and calculate the position information of the first semiconductor substrate CS and the subsequently bonded second semiconductor substrate TD. The computing module may be in communication with the first support 100 for instructing the movement of the first support 100 to align the first semiconductor substrate CS and the subsequently bonded second semiconductor substrates TD at the predetermined positions. In some embodiments, the first sensor 510 is configured to emit the light source LS towards and through the fiducial pattern 410 of the gauging component 400 and detect a relative position of the first semiconductor substrate CS (e.g., the center point of the first semiconductor substrate CS, the position of alignment mark of the first semiconductor substrate CS, etc.) and the fiducial pattern 410 of the gauging component 400. The computing module may receive the detecting result from the first sensor 510 and calculate the position information of the first semiconductor substrate CS to generate a predetermined position on the first semiconductor substrate CS for bonding.

Still referring to FIG. 2A, in some embodiments, the bonding system further includes a third support 300 disposed between the frame FM and the first support 100. For example, a semiconductor wafer is processed by a front-end-of-line (FEOL) operation and a back-end-of-line (BEOL) operation, and then singulated to form a plurality of second semiconductor substrates (i.e. singulated semiconductor dies) TD. After singulation, the second semiconductor substrates TD may be separately disposed on the frame FM. The third support 300 may be configured to temporarily carry the second semiconductor substrates TD picked up from the frame FM. For example, the frame FM includes a dicing tape which is used to adhere to the discrete singulated semiconductor dies. In some embodiments, the third support 300 is disposed proximate to the first support 100 and below the second support 200. In some embodiments, the third support 300 serves as a supplemental stage. For example, the distance between the frame FM and the first support 100 is too far to transfer the second semiconductor substrates TD over the first semiconductor substrate CS in one time. In such embodiments, one of the second semiconductor substrates TD is picked up and disposed on the third support 300 by a pickup head PH as shown by the direction of arrow A1.

After disposing the second semiconductor substrate TD on the third support 300, the second semiconductor substrate TD may be released from the pickup head PH. For example, the pickup head PH is a vacuum head that is capable of picking up die 22 through vacuum. It should be noted that the pickup head PH may use other mechanism(s) to pick up the second semiconductor substrates TD and secure the second semiconductor substrates TD during movement. The second semiconductor substrates TD disposed on the third support 300 may be detected and positioned as will be discussed later in other embodiments. Alternatively, the third support 300 is omitted, and the second semiconductor substrates TD may be picked up from the frame FM and transferred over the first semiconductor substrate CS on the first support 100. In some embodiments, gauging the position of the first semiconductor substrate CS and transferring the second semiconductor substrate TD to the third support 300 are performed during the same process. Alternatively, gauging the first semiconductor substrate CS may be performed before or after transferring the second semiconductor substrate TD to the third support 300 by the pickup head PH.

Referring to FIG. 2B, the second semiconductor substrate TD is transferred from the third support 300 to a position above the first semiconductor substrate CS by a bond head BH of the second support 200, and the position of the second semiconductor substrate TD is gauged by the second sensor 520.

In some embodiments, the second support 200 includes a guide piece 210 and the bond head BH movably installed on the guide piece 210. The actions of bond head BH may be controlled by a driving unit (e.g., motor, controller, and processor, etc.; not shown). For example, the driving unit of the second support 200 is configured to drive the bond head BH to the location of the third support 300, and then the bond head BH is controlled to move downwardly and pick up the second semiconductor substrate TD from the third support 300. The bond head BH may be configured to move upwardly to the position over the third support 300 and/or move forward direction as shown by the direction of arrow A2 in FIG. 2B. For example, the second semiconductor substrate TD is transferred via the bond head BH to a position over the first support 100. The position of the second semiconductor substrate TD taken by the bond head BH may be between the second sensor 520 and the first semiconductor substrate CS. It should be appreciated that although only one bond head is illustrated as an example, more than one bond heads may be installed on the guide piece 210. For example, multiple bond heads may perform a pick-and-place process in turns, and each bond head may be controlled independently from the actions of other bond heads.

In some embodiments, after the second semiconductor substrate TD is transferred to the position above the first semiconductor substrate CS, the second sensor 520 may face towards the second semiconductor substrate TD to determine a location of the alignment mark on the second semiconductor substrate TD. For example, the light source LS of the second sensor 520 emits toward and through the alignment mark (or the center) of the second semiconductor substrate TD, so that the position of the second semiconductor substrate TD is detected by the second sensor 520. Subsequently, after detecting the position of the second semiconductor substrate TD by the second sensor 520, the computing module coupled to the second sensor 520 may receive the detecting result from the second sensor 520 and calculate the position information of the second semiconductor substrate TD based on the detecting result to generate a predetermined position on the first semiconductor substrate CS for bonding the second semiconductor substrate TD to the first semiconductor substrate CS. Based on the predetermined position generated by calculating the detecting result, the computing module may be configured to instruct the first support 100 to adjust the position of the first semiconductor substrate CS to align in the predetermined position for bonding. During adjusting the position of the first semiconductor substrate CS, the movement of the first semiconductor substrate CS may be monitored by the first sensor 510 to ensure the first semiconductor substrate CS is positioned at the predetermined position for bonding. In some other embodiments, the second sensor 520 is coupled to the computing module to determine if the second semiconductor substrate TD is positioned at the predetermined position for bonding. If the second semiconductor substrate TD is not positioned at the predetermined position, the computing module may be in communication with the second support 200 for instructing the fine tuning movement of the bond head BH so as to correct the position of the second semiconductor substrate TD to the predetermined position for bonding.

Since the second semiconductor substrate TD may shift during transferring from the third support 300 to the position above the first support 100, using the second sensor 520 to detect the position of the second semiconductor substrate TD before bonding, the position(s) of the first semiconductor substrate CS and/or the second semiconductor substrate TD may be tuned to the predetermined position(s) for bonding. Since the first sensor 510 continues to monitor the position of the first semiconductor substrate CS on the first support 100, undesired shifting before bonding may be avoided. If undesired shifting occurs, a real-time correction may be performed on the first semiconductor substrate CS, thereby preventing re-work of the bonding process caused by misalignment.

Referring to FIG. 2C, after the second semiconductor substrate TD and the first semiconductor substrate CS are positioned at the predetermined positions, a bonding process of the first semiconductor substrate CS and the second semiconductor substrate TD is performed. For example, the bond head BH is lowered down towards the first support 100 until the second semiconductor substrate TD contacts the first semiconductor substrate CS. The first semiconductor substrate CS may be monitored by the first sensor 510 when bonding the second semiconductor substrate TD to the first semiconductor substrate CS. The bonding process may be monitored by the first sensor 510 and/or the second sensor 520. A real-time observation of alignment shifts in the x, y, z, and 0 direction of the first semiconductor substrate CS may be provided by the first sensor 510. For example, the second semiconductor substrate TD is pressed against the first semiconductor substrate CS while continuing to align the second semiconductor substrate TD to the first semiconductor substrate CS and monitoring by the first sensor 510 and/or the second sensor 520. In some embodiments, the computing module coupled to the first sensor 510 and/or the second sensor 520 may instruct the first support 100 to perform an in-situ and real-time alignment compensation process during bonding the second semiconductor substrate TD to the first semiconductor substrate CS. It should be noted that in the placement of the second semiconductor substrate TD by the bond head BH, the second semiconductor substrate TD is placed with or without pressure applied to press the second semiconductor substrate TD against the first semiconductor substrate CS. During the bonding, a heating process is optionally applied onto the first semiconductor substrate CS and/or the second semiconductor substrate TD depending on the process requirements. In certain embodiments in which the bonding layer (e.g., DAF) is disposed on the first semiconductor substrate CS, heating and pressing may be applied to the bonding layer so as to enhance the adhesion between the first semiconductor substrate CS and the second semiconductor substrate TD.

After the second semiconductor substrate TD is bonded to the first semiconductor substrate CS, the bond head BH may discontinue the pressing of the second semiconductor substrate TD against the first semiconductor substrate CS. Subsequently, the bond head BH of the second support 200 may release the second semiconductor substrate TD. In some embodiments, after releasing the second semiconductor substrate TD, the alignment accuracy of the bonded second semiconductor substrate TD and first semiconductor substrate CS is measured. For example, the bonded position of the second semiconductor substrate TD and the first semiconductor substrate CS is gauged based on the gauging component 400, the first sensor 510 and/or the second sensor 520. The target alignment accuracy (e.g., about 3 µm or less) of the bonded second semiconductor substrate TD and first semiconductor substrate CS may be achieved. Since the relative position of the first semiconductor substrate CS disposed on the first support 100 and the second semiconductor substrate TD picked by the bond head BH can be controlled, the bonding accuracy of the second semiconductor substrate TD and the first semiconductor substrate CS may be improved, thereby increasing the yield.

Continue to FIG. 2C, the pickup head PH may be configured to move to the frame FM and pick up another second semiconductor substrate TD then transfer to place on the third support 300 as shown by the direction of arrow A1. The pickup head PH may be controlled independently from the actions of the bond head BH, so that picking up another second semiconductor substrate TD from the frame FM and transferring to the third support 300 via the pickup head PH may be performed while bonding the second semiconductor substrate TD to the first semiconductor substrate CS. It should be noted that the transferring and bonding steps can be performed in any logical order which are not limited in the disclosure.

Figure 3A:
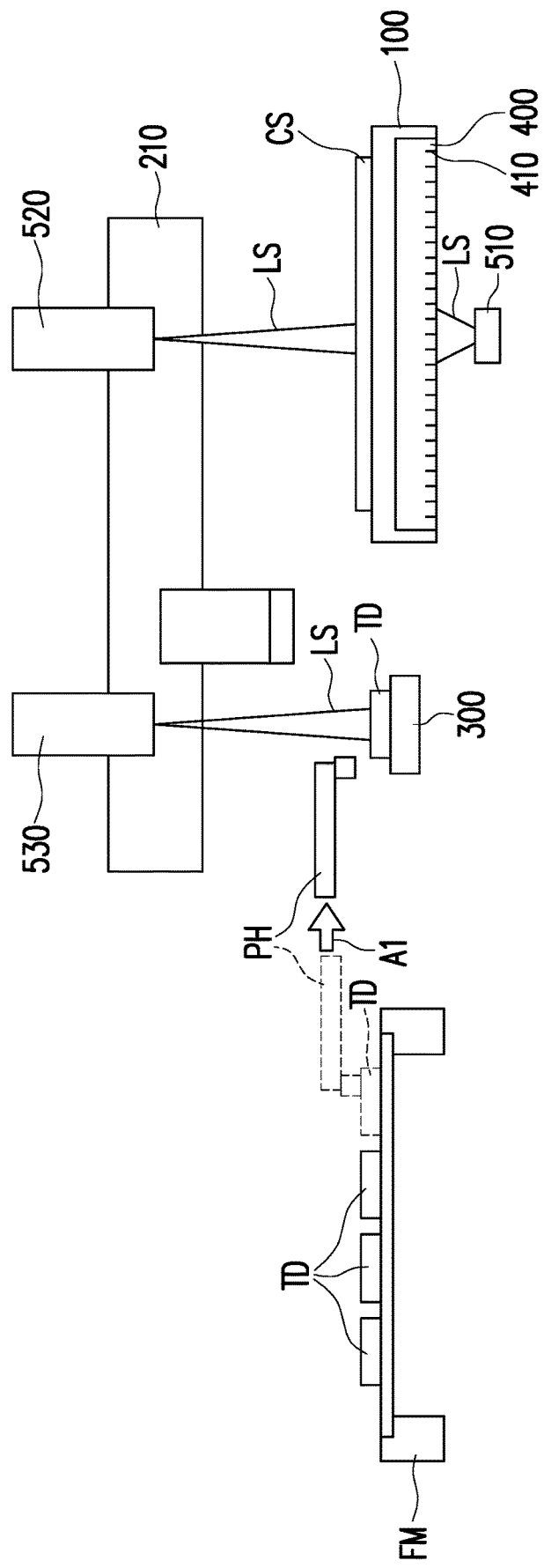
FIG. 3A to FIG. 3C are schematic cross-sectional views of various stages in a method for bonding semiconductor substrates according to some exemplary embodiments of the disclosure.
Figure 3B:
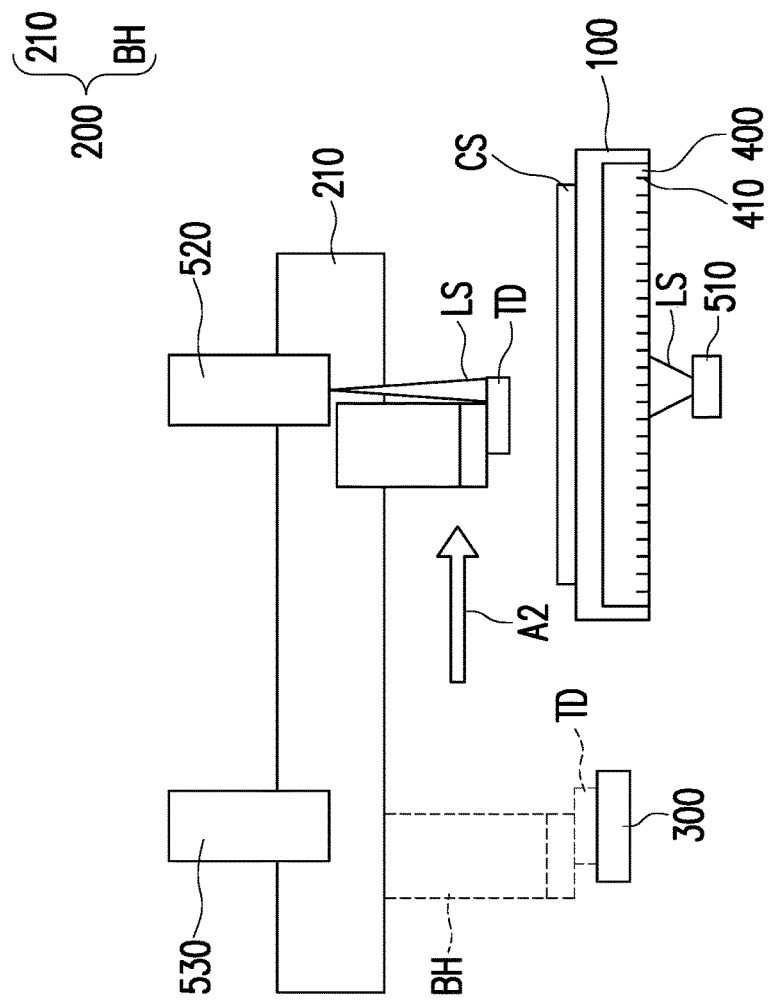
Figure 3B:
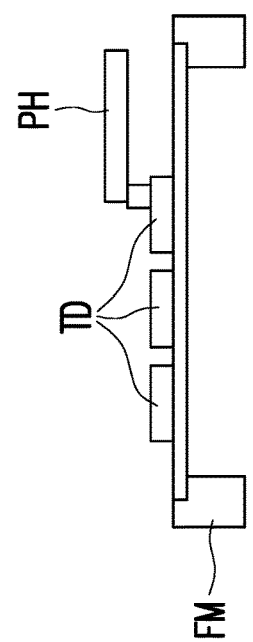
Figure 3C:
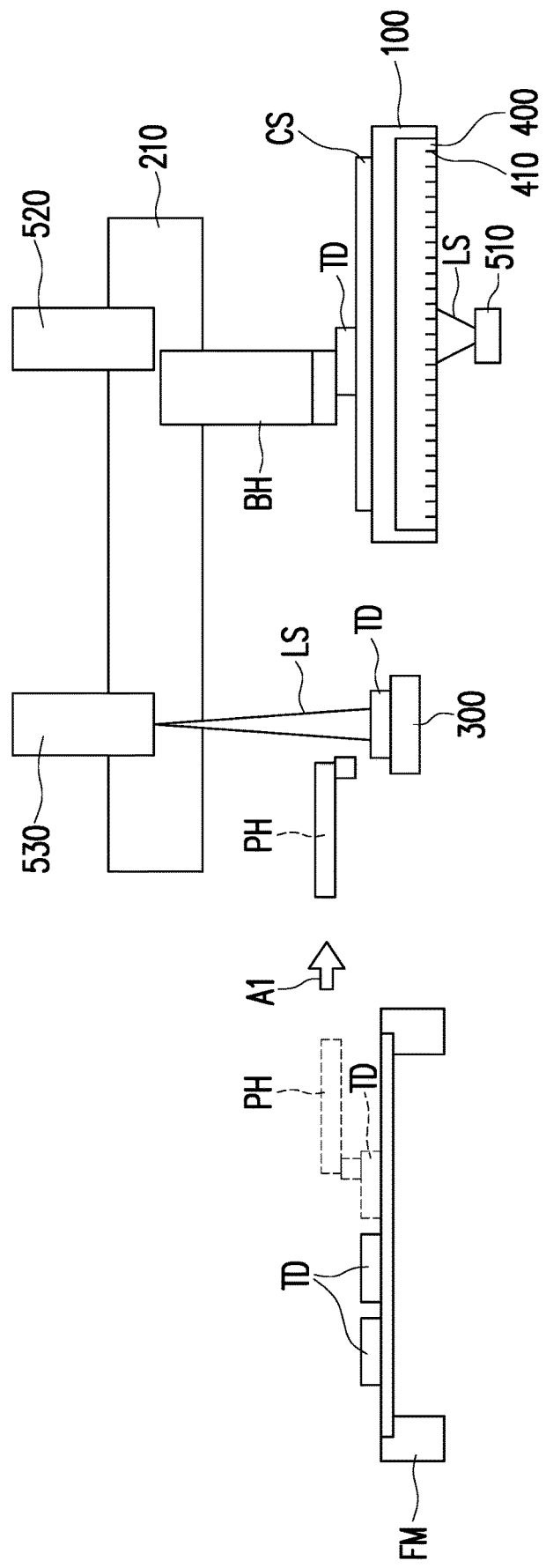

FIG. 3A to FIG. 3C are schematic cross-sectional views of various stages in a method for bonding semiconductor substrates according to some exemplary embodiments of the disclosure. Throughout the various views and illustrative embodiments of the present invention, like reference numbers are used to designate like elements. A bonding system illustrated in FIG. 3A may be similar to the bonding system described in FIG. 2A to FIG. 2C, and the detailed descriptions are simplified herein for brevity. The difference between the bonding system illustrated in FIG. 3A and the bonding system illustrated in FIG. 2A lies in that the bonding system illustrated in FIG. 3A includes a third sensor 530 disposed on the second support 200 and facing towards the third support 300. Referring to FIG. 3A, a position of the first semiconductor substrate CS on the first support 100 is gauged through the fiducial pattern 410 of the gauging component 400 while the light source(s) LS of the first sensor 510 and/or the second sensor 520 may emit towards the first semiconductor substrate CS for calibrating the position of the first semiconductor substrate CS. The gauging process of the first semiconductor substrate CS may be similar to the gauging process described in FIG. 2A, and the detailed descriptions are not repeated herein for brevity.

Continue to FIG. 3A, one of the second semiconductor substrates TD disposed on the frame FM may be picked up and transferred to be placed on the third support 300 through the pickup head PH as shown by the direction of arrow A1. After placing the second semiconductor substrate TD on the third support 300, the pickup head PH may release the second semiconductor substrate TD. Subsequently, the third sensor 530 may emit a light source LS towards the alignment mark of the second semiconductor substrate TD (or the alignment mark disposed on the third support 300) for detecting the position of the second semiconductor substrate TD on the third support 300. The third sensor 530 may be mounted on the guide piece 210 of the second support 200. In some embodiments, the third sensor 530 is disposed next to the second sensor 520, and the third sensor 530 is set to face downwardly to the third support 300 and the second sensor 520 is set to face downwardly to the first support 100. The third sensor 530 may be used as a pattern/mark recognition device for detecting the alignment mark disposed on the second semiconductor substrate TD (or disposed on the third support 300). The third sensor 530 may include a charge coupled device (CCD), an infrared (IR) live CCD adapted to emit reflective infrared (RIR) or transparent infrared (TIR) energy, or the like. The third sensor 530 may be similar to the second sensor 520 or the first sensor 510. In some embodiments, the third sensor 530 is in communication with the computing module which is configured to receive and calculate the position information of the second semiconductor substrate TD relative to the third support 300.

Referring to FIG. 3B, after detecting the position of the second semiconductor substrate TD by the third sensor 530, the second semiconductor substrate TD may be picked up from the third support 300 by the bond head BH of the second support 200, and then transferred over the first support 100 as shown by the direction of arrow A2. For example, the bond head BH is moveably disposed on the guide piece 210. In some embodiments, the bond head BH is configured to move between the second sensor 520 and the third sensor 530. The pickup process and the transferring process of the second semiconductor substrate TD may be similar to the processes described in FIG. 2B, and the detailed descriptions are omitted for brevity.

After the second semiconductor substrate TD is positioned above the first semiconductor substrate CS, the second sensor 520 may detect the position of the second semiconductor substrate TD. The detecting process performing by the second sensor 520 may be similar to the process described in FIG. 2B. In some embodiments, the second semiconductor substrate TD may shift during transferring from the third support 300 to the position above the first support 100, so that the second sensor 520 may detect the position of the second semiconductor substrate TD, and the computing module coupled to the second sensor 520 may calculate the position information of the second semiconductor substrate TD based on the detecting result of the second sensor 520 to check if the position of the first semiconductor substrate CS on the first support 100 needs to be adjusted before bonding. The position-adjusting process of the first semiconductor substrate CS and/or the second semiconductor substrate TD may be similar to the process described in FIG. 2B, and the detailed descriptions are not repeated herein for brevity. In some embodiments, using the third sensor 530 to detect the position of the second semiconductor substrate TD before transferring over the first semiconductor substrate CS may reduce computational burdens and improve computational efficiencies. The subsequent bonding process may be performed in a shorter processing time.

Referring to FIG. 3C, after the second semiconductor substrate TD and the first semiconductor substrate CS are positioned at the predetermined positions, a bonding process of the first semiconductor substrate CS and the second semiconductor substrate TD is performed. The bonding process may be similar to the process described in FIG. 2C, and the detailed descriptions are omitted for brevity. In some embodiments, monitoring the bonding process and detecting the positions of the first and second semiconductor substrates CS and TD relative to the fiducial pattern 410 of the gauging component by the first sensor 510 in real time may reduce or eliminate shift during bonding. The first support 100 may perform a real-time correction of the shift of the first semiconductor substrate CS based on the detecting result of the first sensor 510.

In some embodiments, during or after bonding, the pickup head PH may move to the frame FM to pick up another second semiconductor substrate TD and transfer to place on the third support 300 as shown by the direction of arrow A1, and the next round of the position-detecting process of the another second semiconductor substrate TD disposed on the third support 300 may be performed by the third sensor 530. In some embodiments, the second sensor 520 and the third sensor 530 are fixed on the guide piece 210 of the second support 200. In some embodiments, the guide piece 210 may be or may include a rail, and one or more bond heads BH are configured to move along the rail and transfer the second semiconductor substrates TD to be detected by the second sensor 520 and the third sensor 530. The actions of the pickup head PH may be controlled independently from the actions of the bond head BH, and the transferring and bonding steps can be performed in any logical order. It should be appreciated that a substrate-bonding process may occur at different stages in semiconductor manufacturing.

Although the illustrated embodiments above show the bonding performed at die-to-wafer level, the aforementioned gauging, aligning, and bonding steps may be applied at the wafer-to-wafer level, die-to-die level, or the like.

Figure 4A:
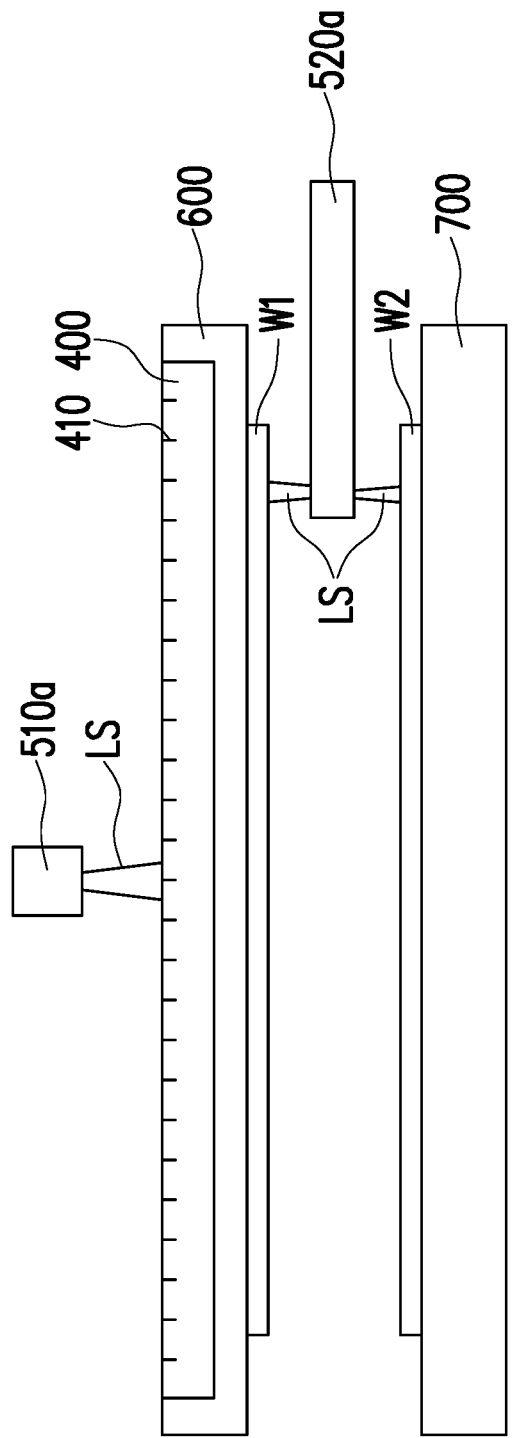
FIG. 4A to FIG. 4C are schematic cross-sectional views of various stages in a method for bonding semiconductor substrates according to some exemplary embodiments of the disclosure.
Figure 4B:
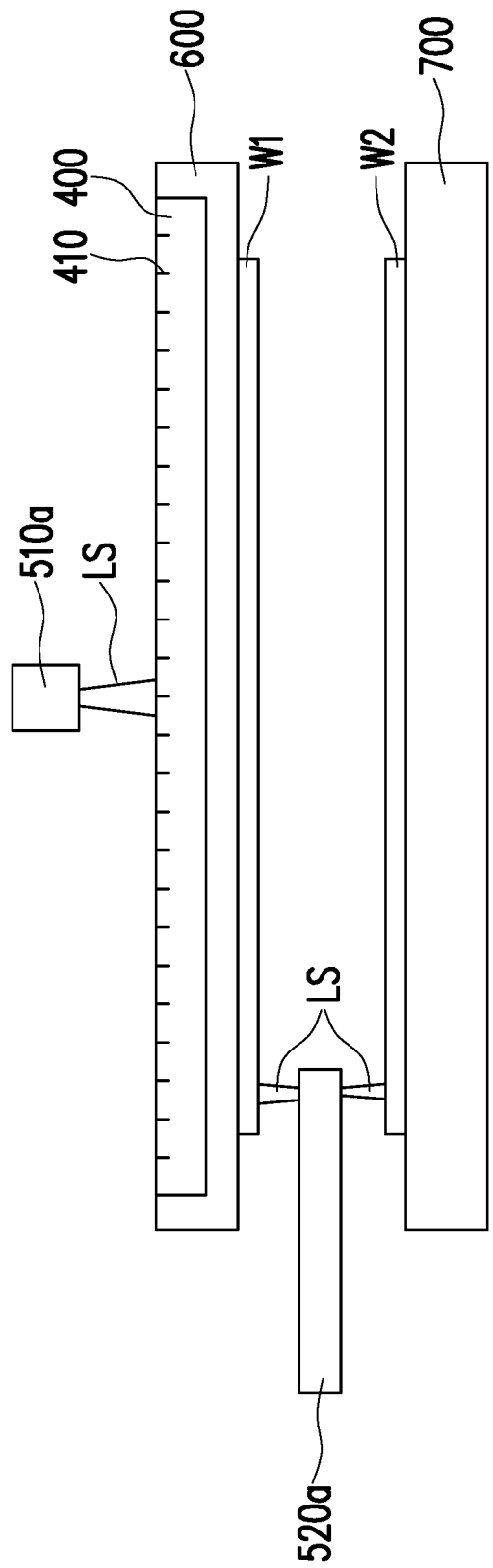
Figure 4C:
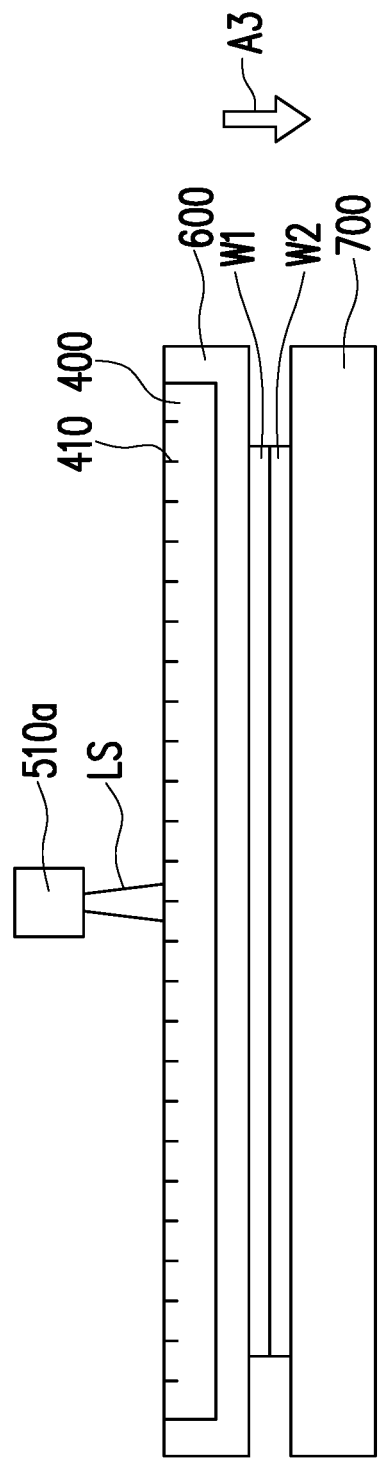

FIG. 4A to FIG. 4C are schematic cross-sectional views of various stages in a method for bonding semiconductor substrates according to some exemplary embodiments of the disclosure. Referring to FIG. 4A and FIG. 4B, a position of a first semiconductor substrate W1 on a first support 600 and a position of a second semiconductor substrate W2 on a second support 700 are detected. The first semiconductor substrate W1 and the second semiconductor substrate W2 may be any type of semiconductor substrate or semiconductor wafer. For example, at least one of the first semiconductor substrate W1 and the second semiconductor substrate W2 is a device wafer. The device wafer may include logic dies, system-on-chip (SoC) dies, application specific integrated circuit (ASIC) dies, image sensor dies, memory dies, or the like. The first semiconductor substrate W1 and the second semiconductor substrate W2 may be prepared for bonding using any suitable processes. Next, the first semiconductor substrate W1 is carried by the first support 600 and the second semiconductor substrate W2 is held onto or retained onto the second support 700. In some embodiments, the first support 600 of the bonding system is configured to be movable relative to the second support 700 so as to perform a bonding process. The second support 700 may be or may include a chuck with vacuum system or clamping fixture for holding the second semiconductor substrate W2 in position on the chuck. The first support 600 may also be or include a chuck with a vacuum system or clamping fixture for holding the first semiconductor substrate W1.

In some embodiments, the gauging component 400 with the fiducial pattern 410 is embedded in the first support 600. The distribution area of the fiducial pattern 410 may be relatively greater in comparison to the bonding region of the first semiconductor substrate W1. The first support 600 may include glass, quartz, or other type of transparent material that aids in intensifying the resolution of the fiducial pattern 410 of the gauging component 400 during the detecting process. A first sensor 510a may be disposed proximate to the first support 600 and may be configured to face towards the fiducial pattern 410 of the gauging component 400 for monitoring during the bonding process. (Note that in the claims, the reference to terms "first sensor" and/or "second sensor" refers to either the first sensor 510a or the second sensor 520a shown in FIG. 4A.) The first sensor 510a may include a charge coupled device (CCD) image sensor, a complementary metal oxide semiconductor (CMOS) image sensor, or any other operable instruments to detect the pattern formed by the transmitted radiation. In some embodiments, the first sensor 510a includes an infrared (IR) live CCD adapted to emit reflective infrared (RIR) or transparent infrared (TIR) energy, or the like. The first sensor 510a may be similar to the first sensor 510 described above.

In some embodiments, the first semiconductor substrate W1 and the gauging component 400 are disposed at two opposing sides of the first support 600, the first semiconductor substrate W1 may face downwardly to the second semiconductor substrate W2, and the fiducial pattern 410 of the gauging component 400 may face upwardly. The light source LS of the first sensor 510a may be configured to emit downwardly to the fiducial pattern 410 of the gauging component 400. The first sensor 510a may be used as a pattern recognition device for detecting the fiducial pattern 410 of the gauging component 400, and the light source LS of the first sensor 510a may emit through the fiducial pattern 410 of the gauging component 400 to the first semiconductor substrate W1, so that a relative position of the fiducial pattern 410 of the gauging component 400 and the first semiconductor substrate W1 is determined based on the detecting result of the first sensor 510a. In some embodiments, the region of the first support 600 where the first semiconductor substrate W1 is disposed on may include a transparent material, so that due to increased visibility, the detection of the position of the first semiconductor substrate W1 relative to the fiducial pattern 410 of the gauging component 400 is improved.

In some embodiments, the second sensor 520a is configured to be movably interposed between the first support 600 and the second support 700 for detecting the positions of the first semiconductor substrate W1 and the second semiconductor substrate W2. The second sensor 520a may be similar to the first sensor 510a. For example, the light sources LS of the second sensor 520a emits towards and through the center point (or any other identifiable point) of the first semiconductor substrate W1 for detecting the position of the first semiconductor substrate CS on the fiducial pattern 410 of the gauging component 400. The light sources LS of the second sensor 520a emits towards the second semiconductor substrate W2 to detect the position of the second semiconductor substrate W2 on the second support 700. In some embodiments, the first semiconductor substrate W1 and the second semiconductor substrate W2 respectively include alignment marks disposed on the peripheral edges facing to each other. For example, as shown in FIG. 4A, the light source LS of the second sensor 520a may emit towards the peripheral edges at first sides of the first semiconductor substrate W1 and the second semiconductor substrate W2, respectively, to detect the positions of the alignment marks at the first sides on the first semiconductor substrate W1 and the second semiconductor substrate W2. The light source LS of the second sensor 520a may emit through the peripheral edge at the first side of the first semiconductor substrate W1 to the fiducial pattern 410 of the gauging component 400 so as to identify the position of the first semiconductor substrate W1 relative to the gauging component 400. In other embodiments, both of the first support 600 and the second support 700 including the gauging components embedded therein, and the second sensor 520a may respectively detect the positions of the first semiconductor substrate W1 and the second semiconductor substrate W2 relative to the gauging components embedded in the first support 600 and the second support 700.

As shown in FIG. 4B, the second sensor 520a may move to second sides (e.g., opposing to the first sides) of the first semiconductor substrate W1 and the second semiconductor substrate W2 and may interpose therebetween so that the light source LS of the second sensor 520a may emit towards the peripheral edges at the second sides of the first semiconductor substrate W1 and the second semiconductor substrate W2, respectively, to detect the positions of the alignment marks at the second sides on the first semiconductor substrate W1 and the second semiconductor substrate W2. In some embodiments, the step illustrated in FIG. 4B is omitted. The first sensor 510a and the second sensor 520a may be coupled to a computing module (not shown) which may be configured to receive and calculate the position information of the first semiconductor substrate W1 and the second semiconductor substrate W2. The computing module may include suitable types of feedback instruments that provide positional feedback. The computing module may be in communication with the first support 600 and/or the second support 700 for instructing the movement(s) of the first support 600 and/or the second support 700 to adjust an x position, a y position, a z position, and/or an angular position of the first semiconductor substrate W1 and/or the second semiconductor substrate W2.

In some other embodiments, the alignment marks may be formed on the first support 600 and/or the second support 700, and the second sensor 520a may be configured to detect the alignment marks on the first support 600 and/or the second support 700 for determining if the first semiconductor substrate W1 and the second semiconductor substrate W2 are positioned at the predetermined positions for bonding. It should be noted that the alignment marks may be formed on any suitable locations (e.g., center, corner, etc.) on the first semiconductor substrate W1 and the second semiconductor substrate W2, and the second sensor 520a can freely move to any locations between the first semiconductor substrate W1 and the second semiconductor substrate W2 without interfering the first semiconductor substrate W1 and the second semiconductor substrate W2. The alignment is achieved by identifying the alignment marks either on the semiconductor substrate(s) or on the first/second support using the second sensor 520a. It is also noted that the configuration shown in FIG. 4A or FIG. 4B is an illustrative example configuration, other configurations are possible.

Referring to FIG. 4C, after detecting and positioning the positions of the first semiconductor substrate W1 and the second semiconductor substrate W2, the second sensor 520a moves away from the movement path of the first support 600. Next, the first semiconductor substrate W1 is lowered as shown by the direction of arrow A3 until the first semiconductor substrate W1 contacts the second semiconductor substrate W2. In some embodiments, a fine alignment is performed of the first semiconductor substrate W1 to the second semiconductor substrate W2 using the first sensor 510a which continues to emit the light source LS for monitoring. It should be noted that any suitable process (e.g., pressing, heating, etc.) may be performed onto the interface of the first semiconductor substrate W1 and the second semiconductor substrate W2 to enhance the adhesion therebetween. While undergoing the pressing, heating, or other applicable process, the fine alignment of the first semiconductor substrate W1 to the second semiconductor substrate W2 is continued via at least the first sensor 510a. For example, the computing module coupled to the first sensor 510a may receive the position information regarding the relative position of the gauging component 400 and the first semiconductor substrate W1, and may calculate the position information based on the detecting result sending from the first sensor 510 so as to instruct the first support 600 and/or the second support 700 adjusting the position(s) of the first semiconductor substrate W1 and/or the second semiconductor substrate W2. The first support 600 and/or the second support 700 may perform an in-situ and real-time alignment compensation process to the first semiconductor substrate W1 and/or the second semiconductor substrate W2 based on the instruction of the computing module.

Afterwards, the first semiconductor substrate W1 and the second semiconductor substrate W2 are bonded together. For example, when lowering the first semiconductor substrate W1, the movement of the first semiconductor substrate W1 is monitored by the first sensor 510a in real-time. For example, when the first support is lowering down, the first semiconductor substrate W1 remains in the aligned position relative to the fiducial pattern 410 of the gauging component 400. In some embodiments, the first sensor 510a may detect undesired shifting during lowering the first semiconductor substrate W1, and the computing module coupled to the first sensor 510*a* may instruct the first support 600 so as to correct the shifted position of the first semiconductor substrate W1. The target alignment accuracy of the bonded first and second semiconductor substrates W1 and W2 may be achieved by a real-time correction. In addition, a real-time correction of alignment shifts may prevent re-work of the bonding process caused by misalignment.

The first sensor 510*a* may trace the first semiconductor substrate W1 at least until the first semiconductor substrate W1 is bonded to the second semiconductor substrate W2. After bonding, the first semiconductor substrate W1 may be released from the first support 600. In some embodiments, after releasing the first semiconductor substrate W1, the alignment accuracy of the bonded first and second semiconductor substrates W1 and W2 is measured. The bonding system described above may be adapted to bond the first semiconductor substrate W1 and the second semiconductor substrate W2 together using such as fusion bonding, eutectic bonding, hybrid bonding, or other types of semiconductor wafer bonding.

The illustrated embodiment in FIG. 4A to FIG. 4C shows the bonding performed at wafer level, wherein the first semiconductor substrate W1 and the second semiconductor substrate W2 are bonded together. In some embodiments, the bonded structure of the first semiconductor substrate W1 and the second semiconductor substrate W2 is referred to as three dimensional integrated circuits (3DICs). In representative manufacturing processes to produce 3DICs, two or more semiconductor substrates (or wafers), each including an integrated circuit, are formed. The semiconductor substrates (e.g., the first semiconductor substrate W1 and the second semiconductor substrate W2) are then bonded with corresponding semiconductor devices aligned to form the 3DIC. The 3DICs may provide a higher density with smaller form factors and allow for increased performance and lower power consumption. By using the aforementioned gauging and aligning processes, the relative positions of first semiconductor substrate W1 and the second semiconductor substrate W2 can be monitored and controlled during the bonding process, thereby improving the throughput of 3DICs. In some embodiments, after bonding, the bonded structure of the first semiconductor substrate W1 and the second semiconductor substrate W2 is diced or singulated into separated semiconductor dies. In some embodiments, after singulating, the semiconductor dies are picked and placed on another carrier substrate to perform a packaging process to form a semiconductor package. Alternatively, the bonding may be performed at the die-to-die level, or the die-to-wafer level depending on the process requirements.

Figure 5A:
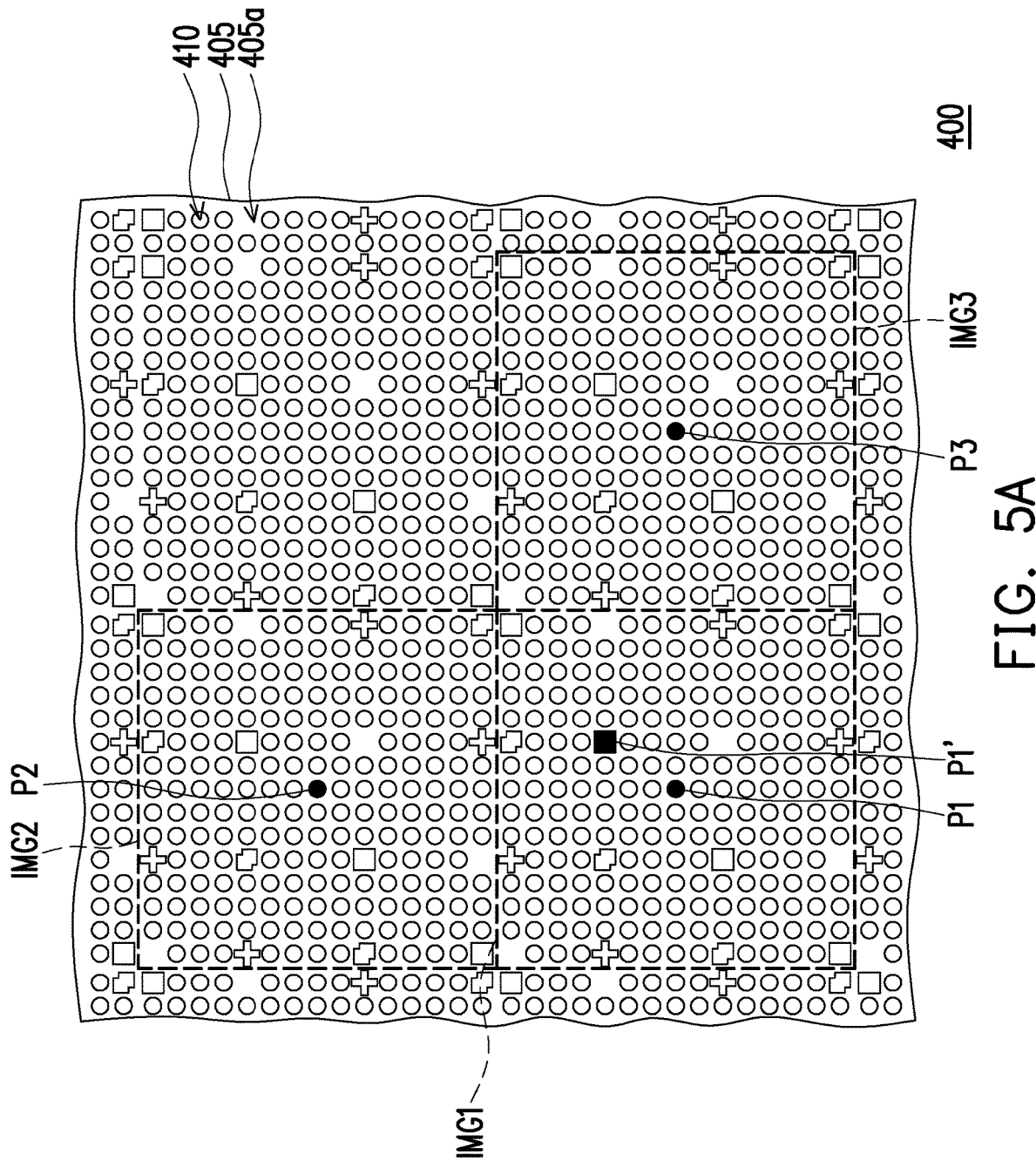
FIG. 5A is a schematic top view of a fiducial pattern on a gauging component according to some exemplary embodiments of the disclosure.
Figure 5B:
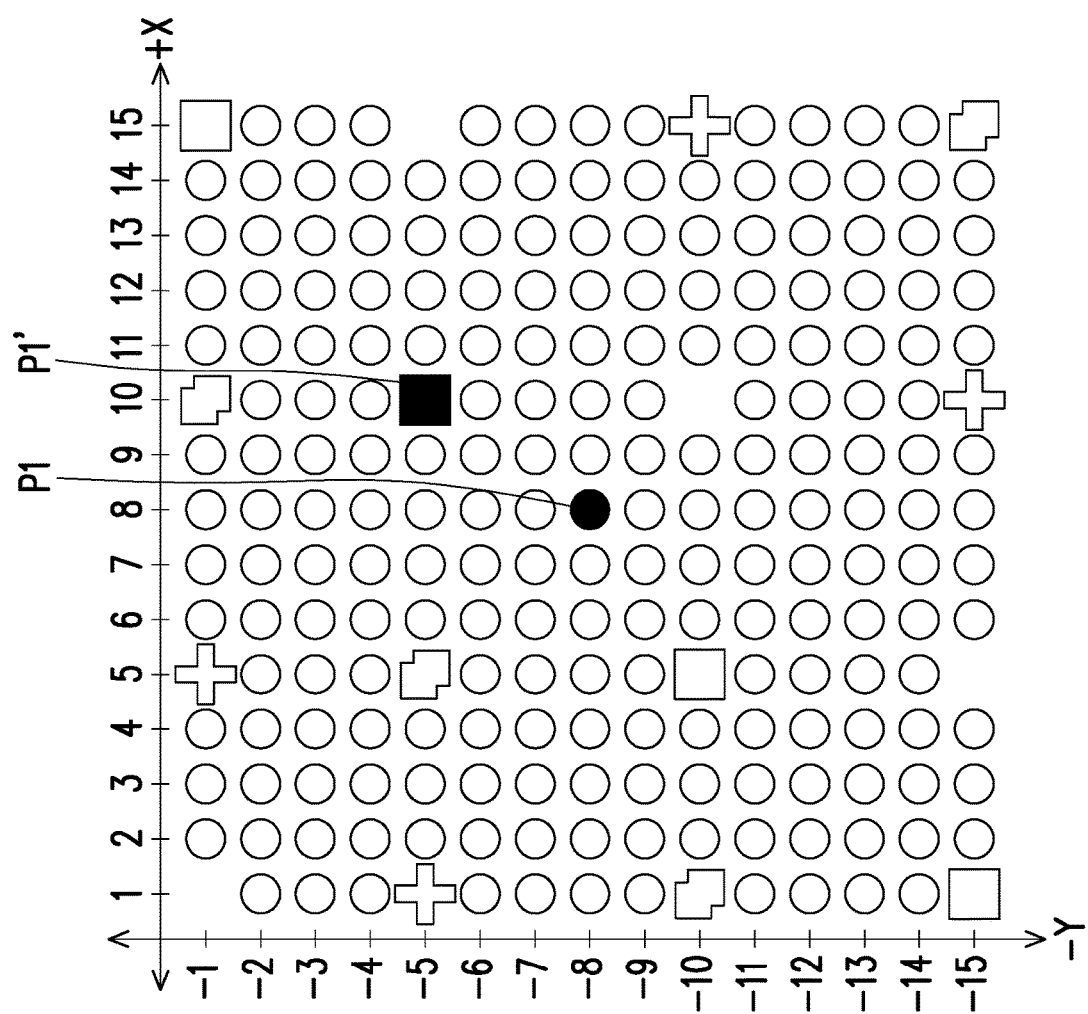
FIG. 5B is a schematic and enlarged top view of a shot region depicted in FIG. 5A according to some exemplary embodiments of the disclosure.

FIG. 5A is a schematic top view of a fiducial pattern on a gauging component according to some exemplary embodiments of the disclosure and FIG. 5B is a schematic and enlarged top view of a first shot region IMG1 depicted in FIG. 5A according to some exemplary embodiments of the disclosure. Referring to FIG. 2A, FIG. 5A, and FIG. 5B, the gauging component 400 includes a wafer (or a photomask) 405 and a fiducial pattern 410 formed on a surface 405*a* of the wafer 405. The wafer 405 may be made of glass, quartz, or other type of transparent material that aids in intensifying the resolution of the fiducial pattern 410. In some embodiments, the fiducial pattern 410 includes a plurality of fiducial cuts 410*a* arranged in an array, such as an "x by y" grid pattern. For example, the fiducial cuts 410*a* are formed on the surface 405*a* of the wafer 405 using lithography and etching technique or other suitable process. The fiducial cuts 410*a* may include various shapes (e.g., circle, oval, square, rectangular, polygon, cross, etc.) in a top view for identification. Alternatively, the fiducial pattern 410 may be a film deposited on the surface 405*a* of the wafer 405 for detecting.

In some embodiments, the fiducial cuts 410*a* are arranged to constitute a coordinate system (X, Y). For example, the coordinate system of the fiducial pattern 410 of the gauging component 400 has an origin on the center of the wafer 405. It should be appreciated that the origin of the coordinate system can be set to any point on the wafer 405. It should be noted that the arrangement of fiducial cuts 410*a* illustrated in FIG. 5A and FIG. 5B is an example configuration, and the fiducial cuts 410*a* may be arranged in other identifiable shapes or patterns. In some embodiments, when positioning the first semiconductor substrate CS, the position of the first semiconductor substrate CS on the first support 100 is adjusted according to the accuracy of the first support 100. Subsequently, the position of the first semiconductor substrate CS is calibrated according to the accuracy of the gauging component 400. The gauging component 400 may provide a high degree of measuring accuracy in order to compensate the limitation of the accuracy of the first support 100. For example, each of the fiducial cuts 410*a* represents a specific point in relation to the X and Y coordinates, and the distance of two adjacent fiducial cuts 410*a* is about 10 μm or less. The distance may depend on the gauge manufacture capability, and may be about 10 times less than accuracy request in general.

In some embodiments, when positioning the first semiconductor substrate CS for bonding, the light source LS of the first sensor 510 may emit through the gauging component 400 and towards the alignment marks on the first semiconductor substrate CS. Next, the first sensor 510 may scan and/or capture the image of the alignment marks on first semiconductor substrate CS relative to the fiducial pattern 410 of the gauging component 400, and the first sensor 510 may be configured to send the detecting result (e.g., image signal, position information, or the like) to the computing module. In some embodiments, the first sensor 510 includes an enlarging focusing system (not shown) for capturing an enlarged image of the fiducial pattern 410. For example, the first shot region IMG1 including a first predetermined position P1 for bonding the second semiconductor substrate TD to the first semiconductor substrate CS is captured by the first sensor 510 to produce an enlarged image as shown in FIG. 5B. In some embodiments, the image signals from the first sensor 510 is delivered to the computing module which may determine the X and Y coordinates of the first predetermined position P1 on the first semiconductor substrate CS relative to the fiducial pattern 410 of the gauging component 400. In the illustrated embodiments, the coordinates (8, −8) of the first predetermined position P1 on the first shot region IMG1 is obtained through the computation by the computing module.

In some embodiments in which the second semiconductor substrate TD shifts during transferring from the third support 300 to the position above the first support 100, the second sensor 520 may detect the position of the second semiconductor substrate TD, and the detecting result from the second sensor 520 may be delivered to the computing module. Next, the computing module is configured to calculate the amount of deviation based on the detecting results from the first sensor 510 and the second sensor 520 so as to generate an adjusted predetermined position P1' of the first semiconductor substrate CS for bonding. Subsequently, the computing module may instruct the first support 100 to perform a fine alignment process to the first semiconductor substrate CS, such that the first predetermined position P1 of the first semiconductor substrate CS is corrected to the adjusted predetermined position P1' for performing the bonding process.

After the second semiconductor substrate TD is bonded to the first semiconductor substrate CS, the enlarging focusing system of the first sensor 510 may be configured to move to another region for the next round of bonding. A multiplicity of shot regions (e.g., the first shot region IMG1, a second shot region IMG2, a third shot region IMG3, etc.) are allocated relative to the bonding surface of the first semiconductor substrate CS in two orthogonal directions (e.g., the X and Y directions). Each of the shot regions is provided with a predetermined position (e.g., P1, P2, P3, etc.) for bonding. The boundaries of the adjacent shot regions may be aligned, may be overlapped, or may be away from one another depending on the process demands. It should be noted that the illustrated embodiment in FIG. 5A is merely for illustrative purposes only. The first sensor 510 may again detect the position of the first semiconductor substrate CS, and then the bonding system repeatedly measures and calculates the predetermined position of the first semiconductor substrate CS on the selected shot regions using the gauging component 400. The detection of the coordinates of the predetermined positions (e.g., P2, P3, etc.) of the first semiconductor substrate CS relative to the fiducial cuts 410a on the selected regions (e.g., a second shot region IMG2, a third shot region IMG3, etc.) is performed sequentially by the similar manner above. Based on the detecting results from the first sensor 510, relative correction on the position to which the first semiconductor substrate CS is to be moved may be performed. The following steps may be repeated as described above, so the detailed descriptions are omitted.

The aligning process as described in FIG. 4A to FIG. 4C may employ the similar orders (e.g., detecting the alignment marks on the first semiconductor substrate W1, determining the coordinates of the alignment marks, adjusting the position of the first semiconductor substrate W1 or the second semiconductor substrate W2, etc.) to achieve the fine alignment and further improve the alignment accuracy for wafer/substrate bonding. It should be noted that some embodiments contemplate methods performed in any logical order. A substrate-bonding process may occur at different stages in semiconductor manufacturing. The aligning process performing by the sensor(s) and the gauging component described herein may be applied to in numerous other contexts for bonding semiconductor substrates.

According to some embodiments, a method of bonding semiconductor substrates is provided. The method includes at least the following steps. A first position of a first semiconductor substrate on a first support is gauged by a gauging component embedded in the first support and a first sensor facing towards the gauging component. A second semiconductor substrate is transferred to a position above the first semiconductor substrate by a second support. A second position of the second semiconductor substrate is gauged by a second sensor mounted on the second support and located above the first support. The first semiconductor substrate is positioned based on the second position of the second semiconductor substrate. The second semiconductor substrate is bonded to the first semiconductor substrate.

According to some embodiments, a method of bonding semiconductor substrates is provided. The method includes at least the following steps. A first position of a first semiconductor substrate on a first support and a second position of a second semiconductor substrate are detected by a first sensor, wherein the first sensor is disposed between the first semiconductor substrate and the second semiconductor substrate. The first semiconductor substrate is lowered to be bonded to the second semiconductor substrate, wherein when lowering the first semiconductor substrate, the first semiconductor substrate is monitored and positioned by a second sensor.

According to some embodiments, an apparatus for bonding semiconductor substrates includes a first support, a gauging component, and a first sensor. The first support is configured to carry a first semiconductor substrate and a second semiconductor substrate bonded to each other. The gauging component is embedded in the first support and includes a fiducial pattern. The first sensor is disposed proximate to the gauging component, and the first sensor is configured to emit a light source towards the fiducial pattern of the gauging component for providing a real-time alignment.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A method of bonding semiconductor substrates, comprising:
   gauging a first position of a first semiconductor substrate on a first support by a gauging component embedded in the first support and a first sensor facing towards the gauging component;
   transferring a second semiconductor substrate to a position above the first semiconductor substrate by a second support;
   gauging a second position of the second semiconductor substrate by a second sensor mounted on the second support and located above the first support;
   positioning the first semiconductor substrate based on the second position of the second semiconductor substrate; and
   bonding the second semiconductor substrate to the first semiconductor substrate.

2. The method according to claim 1, further comprising:
   monitoring the first semiconductor substrate by the first sensor when bonding the second semiconductor substrate to the first semiconductor substrate.

3. The method according to claim 2, wherein monitoring the first semiconductor substrate by the first sensor comprises a real-time alignment compensation process, and the real-time alignment compensation process comprises:
   capturing an image of the gauging component by the first sensor, wherein the image has a predetermined position for bonding the second semiconductor substrate to the first semiconductor substrate;
   transmitting the image to a computing module to determine X and Y coordinates of the predetermined position on the first semiconductor substrate;
   detecting a position of the second semiconductor substrate by the second sensor and transmitting a detecting result to the computing module;

calculating an amount of deviation based on the detecting result and the predetermined position by the computing module to generate an adjusted predetermined position; and bonding the second semiconductor substrate to the first semiconductor substrate based on the adjusted predetermined position.

4. The method according to claim 1, wherein bonding the second semiconductor substrate to the first semiconductor substrate comprises:

pressing the second semiconductor substrate against the first semiconductor substrate while continuing to align the second semiconductor substrate to the first semiconductor substrate by the first sensor, comprising:

capturing an image of the gauging component by the first sensor, wherein the image has a predetermined position for bonding the second semiconductor substrate to the first semiconductor substrate;

transmitting the image to a computing module to determine X and Y coordinates of the predetermined position on the first semiconductor substrate;

detecting a position of the second semiconductor substrate by the second sensor and transmitting a detecting result to the computing module;

calculating an amount of deviation based on the detecting result and the predetermined position by the computing module to generate an adjusted predetermined position; and adjusting relative positions of the first semiconductor substrate and the second semiconductor substrate such that the second semiconductor substrate is bonded to the first semiconductor substrate based on the adjusted predetermined position; and releasing the second semiconductor substrate from the second support.

5. The method according to claim 1, wherein a first alignment process is performed on the first semiconductor substrate by adjusting a position of the first semiconductor substrate based on an alignment mark disposed on the first support after placing the first semiconductor substrate on the first support.

6. The method according to claim 5, wherein a second alignment process is performed on the first semiconductor substrate by adjusting the position of the first semiconductor substrate based on a fiducial pattern of the gauging component.

7. The method according to claim 1, further comprising:
transferring the second semiconductor substrate from a frame to a third support, wherein the third support is disposed between the frame and the first support.

8. The method according to claim 7, further comprising:
detecting a position of the second semiconductor die on the third support by a third sensor before transferring to the first support.

9. The method according to claim 1, wherein the gauging component comprises a fiducial pattern monitored by the first sensor, when gauging the first position of the first semiconductor substrate, a relative position of the fiducial pattern of the gauging component and the first semiconductor substrate is determined by the first sensor.

10. A method of bonding semiconductor substrates, comprising:

placing a first semiconductor substrate on a front side of a first support, wherein the first support comprises a wafer embedded in a back side of the first support and a fiducial pattern is formed on the wafer;

identifying a first position of the first semiconductor substrate on the first support through a first sensor, wherein the first sensor is disposed below the wafer and faces the fiducial pattern;

identifying a second position of a second semiconductor substrate through a second sensor, wherein the second semiconductor substrate is held by a second support, the second sensor is mounted on the second support and the second support is disposed over the first support;

aligning the second position of the second semiconductor substrate with the first position of the first semiconductor substrate; and bonding the second semiconductor substrate to the first semiconductor substrate.

11. The method of claim 10, wherein identifying the first position of the first semiconductor substrate on the first support through the first sensor comprises:

emitting a first light source by the first sensor upwardly though the wafer and toward the first semiconductor substrate.

12. The method of claim 11, wherein identifying the first position of the first semiconductor substrate on the first support through the first sensor further comprises:

emitting a second light source by the second sensor downwardly to the first semiconductor substrate.

13. The method of claim 10, further comprising:
moving the second semiconductor substrate from a frame to a third support, wherein the third support is disposed between the frame and the first support; and picking up the second semiconductor substrate from the third support by the second support, before identifying the second position of the second semiconductor substrate through the second sensor.

14. The method of claim 13, further comprising:
performing a position-detecting process on the second semiconductor substrate disposed on the third support through a third sensor, wherein the third sensor is mounted on the second support, before picking up the second semiconductor substrate from the third support.

15. A method of bonding semiconductor substrates, comprising:

gauging a first position of a first semiconductor substrate on a first support by a gauging component embedded in the first support, alignment marks disposed on the first support, and a first sensor facing towards the gauging component;

transferring a second semiconductor substrate to a position above the first semiconductor substrate by a second support;

gauging a second position of the second semiconductor substrate by a second sensor mounted on the second support and located above the first support;

positioning the first semiconductor substrate based on the second position of the second semiconductor substrate; and bonding the second semiconductor substrate to the first semiconductor substrate.

16. The method according to claim 15, further comprising:
monitoring the first semiconductor substrate by the first sensor when bonding the second semiconductor substrate to the first semiconductor substrate.

17. The method according to claim 15, further comprising:
transferring the second semiconductor substrate from a frame to a third support, wherein the third support is disposed between the frame and the first support.

18. The method according to claim 17, further comprising:
    detecting a position of the second semiconductor die on the third support by a third sensor before transferring to the first support.

19. The method according to claim 15, wherein the gauging component comprises a fiducial pattern monitored by the first sensor, when gauging the first position of the first semiconductor substrate, a relative position of the fiducial pattern of the gauging component and the first semiconductor substrate is determined by the first sensor.

20. The method according to claim 19, wherein a distribution area of the fiducial pattern of the gauging component is greater than a bonding area of the first semiconductor substrate.

\* \* \* \* \*